United States Patent
Okuda et al.

(10) Patent No.: US 7,622,396 B2
(45) Date of Patent: Nov. 24, 2009

(54) METHOD OF PRODUCING A SEMICONDUCTOR DEVICE

(75) Inventors: Kazuyuki Okuda, Tokyo (JP); Yasushi Yagi, Tokyo (JP); Toru Kagaya, Tokyo (JP); Masanori Sakai, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/155,625

(22) Filed: Jun. 6, 2008

(65) Prior Publication Data

US 2008/0250619 A1 Oct. 16, 2008

Related U.S. Application Data

(63) Continuation of application No. 11/121,919, filed on May 5, 2005, which is a continuation of application No. 10/411,092, filed on Apr. 11, 2003, now Pat. No. 6,905,549.

(30) Foreign Application Priority Data

Apr. 11, 2002 (JP) ............................ 2002-109130

(51) Int. Cl.
*H01L 21/31* (2006.01)

(52) U.S. Cl. .................. 438/758; 438/771; 438/772; 438/775; 257/632; 257/E33.03; 257/E33.06; 427/579; 427/255.29

(58) Field of Classification Search ................ 438/758, 438/765, 762, 769, 775, 776, 777; 427/579, 427/255.29; 257/632, E33.06, 119, E23.077, 257/131, 133
See application file for complete search history.

(56) References Cited

U.S. PATENT DOCUMENTS

| 5,250,323 | A | 10/1993 | Miyasaki |
| 5,484,484 | A | 1/1996 | Yamaga |
| 5,888,579 | A | 3/1999 | Lun |
| 5,916,365 | A | 6/1999 | Sherman |

(Continued)

FOREIGN PATENT DOCUMENTS

JP 6-163434 A 6/1994

(Continued)

OTHER PUBLICATIONS

Korean Office Action of Jun. 16, 2008 for counterpart application 2006-233849.

(Continued)

*Primary Examiner*—Savitri Mulpuri
*Assistant Examiner*—Yasser A Abdelaziez
(74) *Attorney, Agent, or Firm*—Birch, Stewart, Kolasch & Birch, LLP (57) ABSTRACT

A semiconductor device is produced by providing a reaction chamber with a substrate and sequentially repeating steps of: supplying a first kind of gas into the reaction chamber, exhausting the first kind of gas from the reaction chamber, supplying a second kind of gas into the reaction chamber, and exhausting the second kind of gas from the reaction chamber to process the substrate disposed in the reaction chamber. The first kind of gas is pre-reserved in an intermediate portion of a supply path through which the first kind of gas flows, and is supplied into the reaction chamber with exhaust of the reaction chamber being substantially stopped.

20 Claims, 5 Drawing Sheets

U.S. PATENT DOCUMENTS

2002/0094306 A1* 7/2002 Hara et al. ............. 422/112

FOREIGN PATENT DOCUMENTS

| JP | 6222388 A | 8/1994 |
| JP | 09-077593 | 3/1997 |
| JP | 9-77593 A | 3/1997 |
| JP | 9-82696 A | 3/1997 |
| JP | 09-82696 A | 3/1997 |
| JP | 11-087341 | 3/1999 |
| JP | 2001-303251 A | 10/2001 |

OTHER PUBLICATIONS

Korean Office Action of Dec. 15, 2008 for counterpart application 2006-233849.

Hiroshi Goto et al.; "Atomic Layer Controlled Deposition of Silicon-Nitride with Self-Limiting Mechanism;" Technical Report of IEICE, SDM95-181, Dec. 1995; pp. 47-54.

Shunsuke Morishita et al.; "Atomic-Layer Chemical-Vapor-Deposition of Silicon-Nitride;" Applied Surface Science 112; 1997, pp. 198-204.

Suguru Kanemoto et al.; "Silicon Shot Gas Epitaxy-Dose Controlled Digital Epitaxy;" (30p-HA-1), Extended Abstracts (the 54th Autumn Meeting), Sep. 1993, pp. 335.

* cited by examiner

METHOD OF PRODUCING A SEMICONDUCTOR DEVICE

This application is a continuation of co-pending application Ser. No. 11/121,919, filed on May 5, 2005, which is a continuation of application Ser. No. 10/411,092, filed on Apr. 11, 2003, now U.S. Pat. No. 6,905,549, for which priority is claimed under 35 U.S.C. § 120. This application claims priority of application Ser. No. 2002-109130 filed in Japan on Apr. 11, 2002 under 35 U.S.C. § 119; the entire contents of all are hereby incorporated by reference.

BACKGROUND OF THE INVENTION

1. Field of the Invention

The present invention relates to a vertical type semiconductor device producing apparatus, and more particularly, to a vertical type semiconductor device producing apparatus which alternately flows a plurality of kinds of gases contributing to film formation, and forms films on stacked substrates.

2. Description of the Related Art

Figure 7:
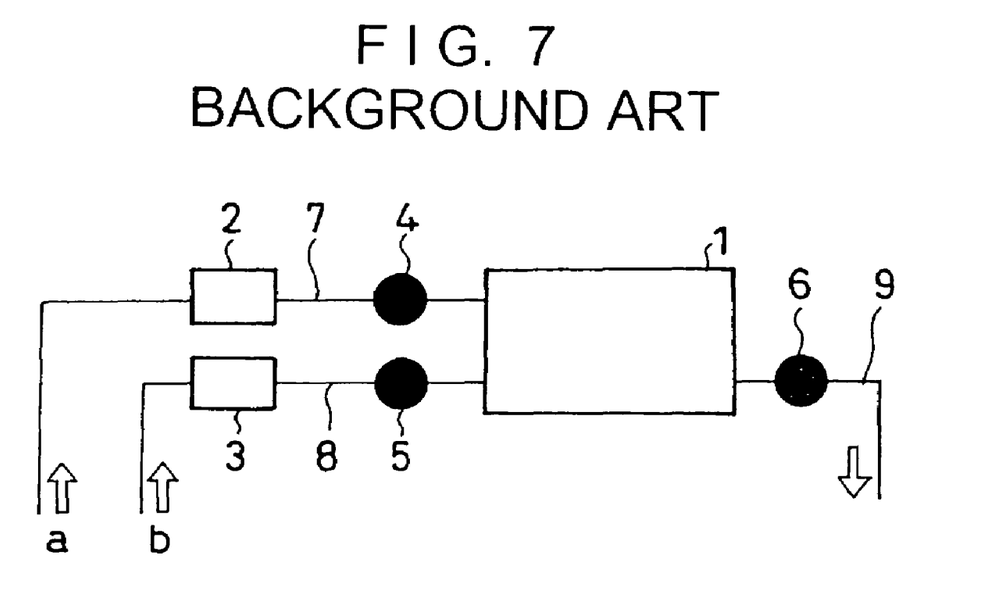
FIG. 7 is a schematic block diagram of a conventional ALD apparatus.

FIG. 7 shows an atomic layer deposition apparatus (ALD apparatus, hereinafter) which is a conventional semiconductor device producing apparatus which alternatively flows a plurality of kinds of gases contributing to film formation, and forms films. In this apparatus, two kinds of process gases a and b which contribute to film formation are alternately supplied into a reaction chamber 1, the reaction chamber 1 is exhausted, the gases are adsorbed onto substrates in the reaction chamber 1 and reacted, thereby forming films on the substrates. In this case, a gas supply amount of the process gases a and b is determined by controlling the flow rate by mass flow controllers (MFC) 2 and 3 provided in gas supply tubes 7 and 8. A pressure in the reaction chamber 1 is determined by controlling an exhaust amount by adjusting opening of an exhaust valve 6 provided in the exhaust tube 9.

According to the conventional ALD apparatus, however, when process gas is supplied to the reaction chamber, since the process gas is supplied while controlling the exhaust amount from the reaction chamber, a gas pressure can not rise in a short time, and there is a defect that the adsorbing speed and reacting speed are slow due to the delay of the gas pressure rise. In the case of single substrate-feeding type ALD apparatus which simultaneously processes about one or two substrates, since a capacity of the reaction chamber is small, this defect is not so serious. In a case of a batch type vertical type ALD apparatus which simultaneously processes a large number of stacked substrates, however, since a capacity of the reaction chamber is large, delay in adsorbing and reacting speed appears remarkably, and there is a problem that throughput is largely deteriorated.

Japanese Patent Application Laid-open No. 9-82696 describes a single substrate-feeding type film forming apparatus which keeps flowing oxygen (O) radical into a reaction chamber, TEOS gas is intermittently supplied for about two seconds each, and cohesive films are formed. In this apparatus, a gas supply system in which gas is supplied from a TEOS cylinder to a reaction chamber is provided with gas reservoirs 303 and 304, TEOS gas reserved in the gas reservoirs is supplied to the reaction chamber. Since two gas reservoirs are provided, it is possible to reserve gas in one of the gas reservoirs while the other one is being used, and the throughput is enhanced. However, the apparatus provided with the gas reservoirs is of single substrate-feeding type in which a capacity of the reaction chamber is small, and the apparatus is not a vertical type apparatus having a large capacity of the reaction chamber. Further, the apparatus is not the ALD apparatus which alternately supplies process gas a and b into the reaction chamber.

SUMMARY OF THE INVENTION

It is a main object of the present invention to provide a vertical type semiconductor device producing apparatus which alternately flows a plurality of kinds of gases which contribute to film formation, and which can enhance the throughput.

According to a first aspect of the present invention, there is provided a vertical type semiconductor device producing apparatus, comprising:
 a vertical type reaction chamber which is to accommodate a plurality of stacked substrates;
 an exhaust path which exhausts the reaction chamber,
 a vacuum exhaust device which exhausts the reaction chamber through the exhaust path;
 an exhaust valve which opens and closes the exhaust path;
 a first supply path which supplies a first kind of gas, which contributes to film formation, to the reaction chamber;
 a second supply path which supplies a second kind of gas, which contributes to the film formation, to the reaction chamber;
 a first and a second gas supply valves which respectively open and close the first and second supply paths; and
 a controller which controls the exhaust valve and the first and second gas supply valves such that when the first kind of gas is supplied to the reaction chamber, the first kind of gas is supplied to the reaction chamber from the first supply path in a state in which exhaust of the reaction chamber is being stopped to expose the plurality of substrates in the reaction chamber to the first kind of gas, and when the second kind of gas is supplied to the reaction chamber, the second kind of gas is supplied to the reaction chamber through the second supply path in a state in which the reaction chamber is being exhausted by the vacuum exhaust device to expose the plurality of substrates in the reaction chamber to the second kind of gas.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

According to a preferred embodiment of the present invention, there is provided a vertical type semiconductor device producing apparatus, comprising:

a vertical type reaction chamber which is to accommodate a plurality of stacked substrates;

an exhaust path which exhausts the reaction chamber, a vacuum exhaust device which exhausts the reaction chamber through the exhaust path;

an exhaust valve which opens and closes the exhaust path;

a first supply path which supplies a first kind of gas, which contributes to film formation, to the reaction chamber;

a second supply path which supplies a second kind of gas, which contributes to the film formation, to the reaction chamber;

a first and a second gas supply valves which respectively open and close the first and second supply paths; and a controller which controls the exhaust valve and the first and second gas supply valves such that when the first kind of gas is supplied to the reaction chamber, the first kind of gas is supplied to the reaction chamber from the first supply path in a state in which exhaust of the reaction chamber is being stopped to expose the plurality of substrates in the reaction chamber to the first kind of gas, and when the second kind of gas is supplied to the reaction chamber, the second kind of gas is supplied to the reaction chamber through the second supply path in a state in which the reaction chamber is being exhausted by the vacuum exhaust device to expose the plurality of substrates in the reaction chamber to the second kind of gas.

According to this vertical type semiconductor device producing apparatus, the first kind of gas is supplied to the reaction chamber in a state in which the exhaust is stopped, thereby bringing the reaction chamber into a pressure-rising state. Therefore, as compared with a technique for rising a pressure in the reaction chamber while controlling the exhaust amount, even in a vertical type ALD having a reaction chamber of large capacity, it is possible to rise the pressure in the reaction chamber for a short time, and to easily obtain the pressure-rise state. As the pressure rising time is shorter and a degree of pressure rise is higher, it is possible to enhance the adsorption to the substrate and the film-forming speed, and the throughput is enhanced.

Preferably, the first supply path has a gas reservoir in which the first kind of gas is reserved, and when the first kind of gas is supplied to the reaction chamber, the controller allows the first kind of gas to flow into the first supply path to reserve the first kind of gas in the gas reservoir, and the controller allows the first kind of gas reserved in the gas reservoir to be supplied to the reaction chamber from the gas reservoir in a state in which the exhaust of the reaction chamber is stopped to expose the plurality of substrates in the reaction chamber to the first kind of gas.

According to this structure, the first kind of gas is reserved in the gas reservoir, the first kind of gas reserved in the gas reservoir is supplied to the reaction chamber in a state in which the exhaust is stopped, thereby bringing the reaction chamber into the pressure-rise state. Therefore, as compared with a technique in which a pressure in the reaction chamber is increased while controlling the exhaust amount, even in the vertical type ALD having large capacity of the reaction chamber, it is possible to instantaneously rise the pressure in the reaction chamber, and to easily obtain the high pressure-rise state. It is possible to enhance the adsorption to the substrate and the film-forming speed, and the throughput is largely enhanced.

Next, an embodiment of the present invention will be explained in detail with reference to the drawings.

Figure 6A:
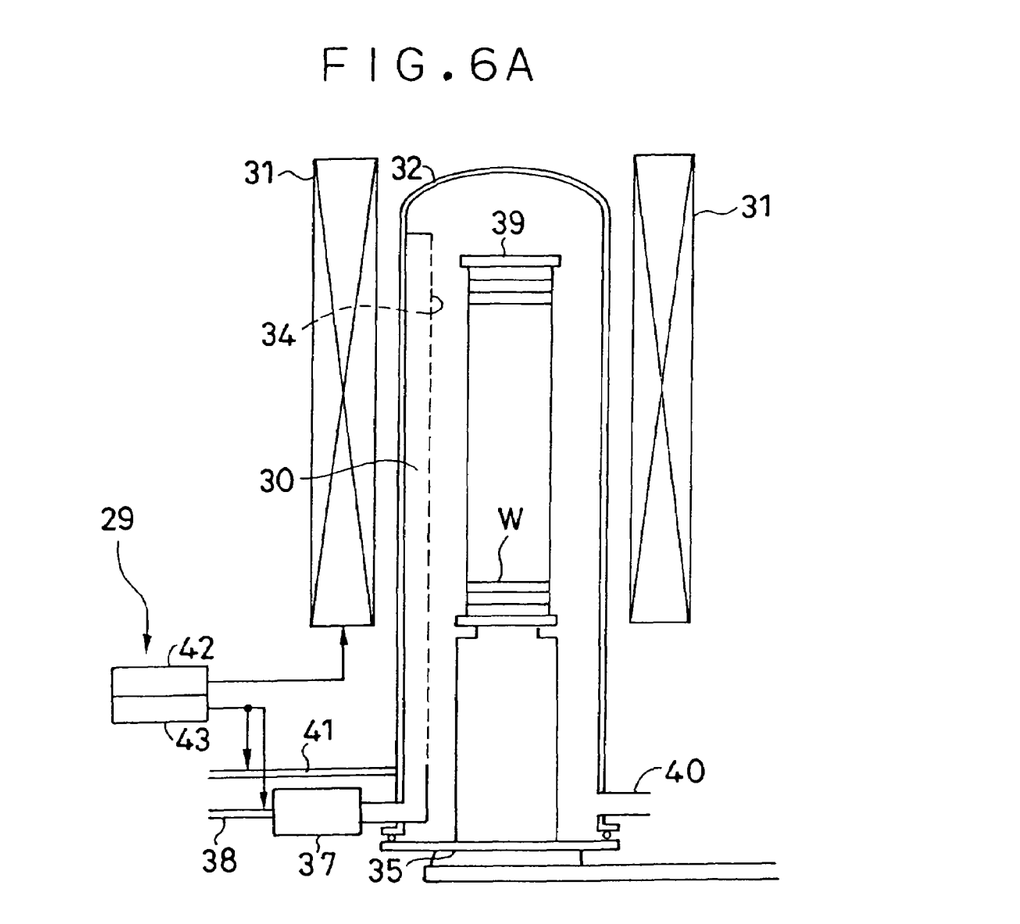
FIGS. 6A and 6B are schematic diagrams of a vertical type ALD apparatus according to the embodiment.
Figure 6B:
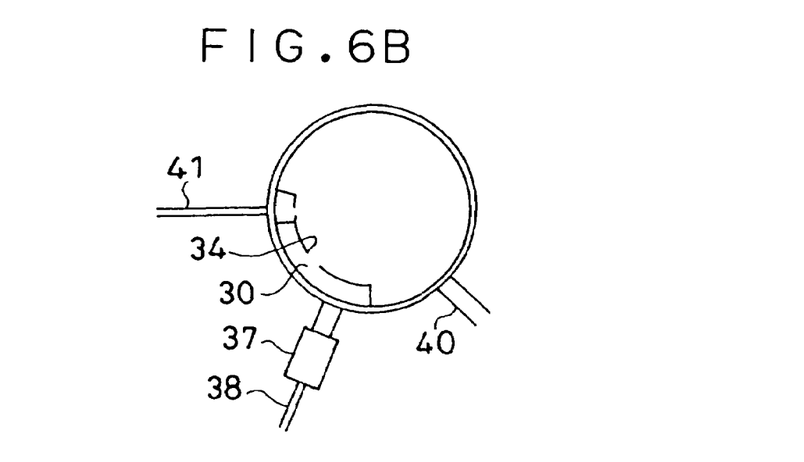

FIGS. 6A and 6B show a basic structure of a vertical type ALD apparatus according to the embodiment, wherein FIG. 6A is a schematic vertical sectional view and FIG. 6B is a schematic lateral sectional view. A reaction tube 32 constituting a reaction chamber which processes substrates is provided inside a heater 31. A lower opening of the reaction tube 32 is air-tightly closed with a seal cap 35. A boat 39 stands on the seal cap 35, and the boat 39 is inserted into the reaction tube 32. A plurality of substrates W are stacked in a multistage manner in an axial direction of the reaction tube. Each of the substrates W is placed horizontally. The heater 31 heats the substrates W in the reaction tube 32 to a predetermined temperature.

Two gas supply tubes as supply paths supply a plurality of (two, in this embodiment) gases into the reaction tube 32. Of the gas supply tubes, the first gas supply tube 41 is connected one side of the reaction tube 32 without through a remote plasma unit, and the second gas supply tube 38 is connected to the one side of the reaction tube 32 through a remote plasma unit 37. Therefore, there exist two kinds of gases supplied to the plurality of substrates W in the reaction tube 32, i.e., gas which is not excited by plasma and supplied, and gas which is excited by plasma and supplied as active species. The reaction tube 32 is provided at its other side with an exhaust tube 40 as an exhaust path for exhausting the reaction chamber. A vacuum pump (not shown) as vacuum exhaust means is connected to the exhaust tube 40.

A remote plasma unit 37 is connected to a nozzle 30 which stands in the reaction tube 32 along the boat 39. The nozzle 30 is provided with a large number of access holes 34 along an axial direction of the nozzle such as to be respectively opposed to the large number substrates stacking in the multistage manner.

The access holes 34 are formed such that their diameters of the holes 34 are smaller as closer to an upstream side of gas flow and larger as closer to a downstream side of the gas flow so that excited gas or non-excited gas is uniformly supplied from a substrate W at upstream side of gas flow to a substrate W at downstream side of the gas flow. With this structure, conductance is changed, and gas is injected to the upstream side and downstream side uniformly.

Further, control means for controlling a manner of flowing the two kinds of gas and a film forming temperature of the substrates W is provided. The control means includes gas-supply control means 43 for controlling the gas flow such as to alternately flow the two kinds of gas repeatedly one kind by one kind, and temperature control means 42 for controlling a film forming temperature by the heater.

Next, a method for forming films using the vertical type ALD apparatus having the above-described basic structure will be explained. As a film, a $Si_3N_4$ film is formed. The reaction gases are DCS ($SiH_2Cl_2$: dichlorsilane) and plasma-processed $NH_3$.

First, substrates W on which films are to be formed are mounted to the boat 39 and transferred into the reaction tube 32 (furnace). Next, $Si_3N_4$ films are formed. A temperature in the furnace at that time is set to a temperature at which adhesion with a lower film is excellent and films having small interface defect are formed, e.g., 350 to 600° C. For this film forming operation, there is used an ALD method which alternately flows $NH_3$ and DCS to form films by one atomic layer by one atomic layer.

First, $NH_3$ is supplied from the second gas supply tube 38. Since $NH_3$ is higher in reaction temperature than DCS, $NH_3$ is not reacted at the temperature in the furnace. The $NH_3$ is excited by plasma using the remote plasma unit 37 and is brought into the active species and is allowed to flow so that $NH_3$ is reacted at the temperature in the furnace. At that time, a pressure in the furnace is maintained at relatively low pressure of 30 to 60 Pa and in this state, $NH_3$ which was brought into the active species by plasma excitation is supplied for 5 to 120 seconds. Gas flowing into the furnace is only $NH_3$ which is brought into the active species by plasma excitation, and no DCS exists. Therefore, $NH_3$ which is brought into the active species by plasma excitation does not cause vapor-phase reaction and is reacted in surface with the lower film on the substrate W.

Next, DCS is supplied from the first gas supply tube 41. At that time, the exhaust from inside of the furnace is stopped. Since DCS is reacted at the temperature in the furnace, it is unnecessary to excite DCS by plasma. A pressure in the furnace at that time is increased to 266 to 931 Pa which is higher than that when $NH_3$ is supplied. By supplying DCS, $NH_3$ on the lower film and DCS are reacted in surface, and $Si_3N_4$ films are formed.

A step for alternately flowing the $NH_3$ and DCS is defined as one cycle. By repeating this cycle, a $Si_3N_4$ film having a predetermined thickness is formed. In the ALD method, since two kinds of gas which contribute to the film formation do not exist in a vapor phase, the gas is adsorbed in the lower film surface and reacted with the lower film. Therefore, a film having excellent adhesion with the lower film can be obtained, and defect of interface is reduced as compared with the CVD (Chemical Vapor Deposition) method in which two kinds of gas are allowed to flow simultaneously. Further, $NH_3$ gas of the plurality of kinds of gas which need plasma excitation is plasma excited and brought into active species and allowed to flow, films can be formed at a reaction temperature by DCS gas which need not the plasma excitation and thus, the films can be formed at a low temperature as low as 350 to 600° C.

In a general vertical type CVD apparatus, when DCS gas which is film-forming gas is to be supplied, the DCS gas is supplied while controlling the exhaust amount from the reaction chamber. If the exhaust from the reaction chamber is stopped here, a film thickness of a substrate at the upstream side of the DCS gas supply becomes thick, and a substrate W closer to the downstream side of the DCS gas has thinner thickness of a film formed on the substrate, and there is an adverse possibility that the film thickness uniformity between the plurality of wafers is largely deteriorated. If the film-forming gas is supplied without exhaust, this can be a cause of particle generation, and since the film-forming gas is not supplied without exhaust, when the process gas is supplied into the reaction chamber, a conventional vertical type ALD apparatus supplies the gas while controlling the exhaust amount from the reaction chamber.

As a result of hard research and repetition of experiments, it was found that in the case of a batch type vertical ALD apparatus of the above-described present invention, the uniformity between a plurality of wafers was excellent even if the exhaust from the reaction chamber was stopped, and a problem related to the particle generation was not caused. Further, since the batch type vertical ALD apparatus of the invention processes a large number of substrates (100 to 150) at a time, the capacity of the reaction chamber is extremely large as compared with the single substrate-feeding type apparatus which processes one to three substrates. Therefore, when a pressure is increased from a decompression state in which the reaction chamber is exhausted, since the exhaust from the exhaust tube 40 is stopped, it is possible to rise the gas pressure in a short time, the adsorption speed and reaction speed are increased due to the gas pressure rise, and the processing efficiency of substrates is remarkably enhanced.

Figure 1:
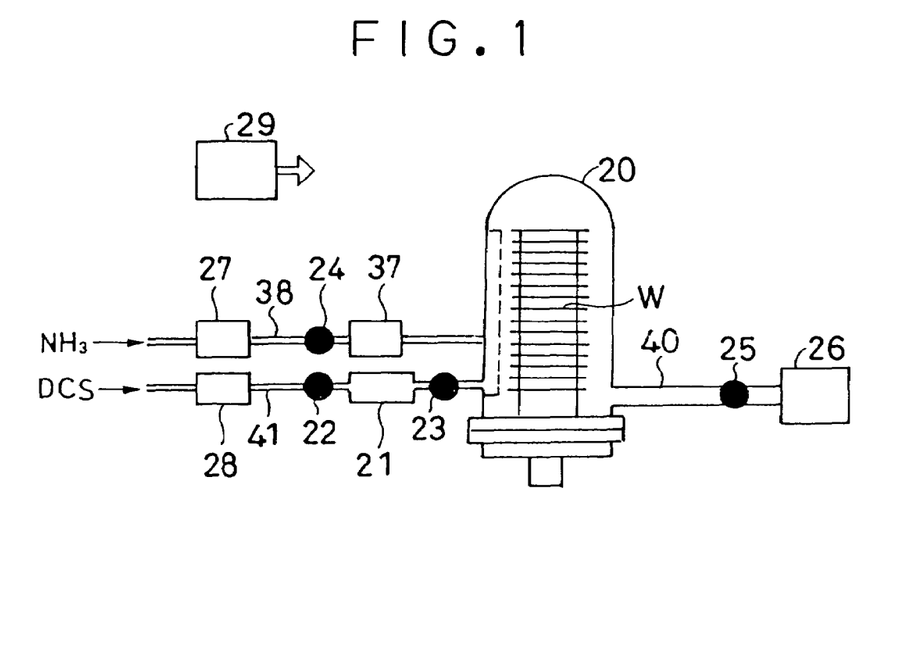
FIG. 1 is a schematic block diagram of a vertical type semiconductor device producing apparatus according to an embodiment.

In the vertical type ALD apparatus of the embodiment, in addition to the basic structure shown in FIG. 6A and 6B, a first gas supply tube 41 is provided with a gas reservoir 21, and DCS gas is supplied from the gas reservoir 21.

A structure in FIG. 1 will be explained in detail. The vertical type ALD adsorbing amount includes a vertical type reaction furnace 20 which processes the large number of stacked substrates W. The reaction furnace 20 is provided with an exhaust tube 40 for exhausting the reaction furnace 20, a first gas supply tube 41 for supplying DCS to the reaction furnace 20, and a second gas supply tube 38 for exciting $NH_3$ by plasma and bringing the same into active species and supplying the same to the reaction furnace 20.

The first gas supply tube 41 through which DCS flows is provided at its intermediate portion with the gas reservoir 21 for reserving DCS. The gas reservoir 21 is a gas tank or a helical tube having greater gas capacity than a usual tube.

The upstream side first gas supply tube 41 of the gas reservoir 21 is provided with a first gas supply valve 22 for opening and closing the tube, and the downstream side first gas supply tube 41 is provided with a second gas supply valve 23 for opening and closing the tube. By opening and closing the first gas supply valve 22 or the second gas supply valve 23, DCS gas as the first kind of gas is reserved in the gas reservoir 21 through the first gas supply tube 41, and the reserved DCS gas is supplied to the reaction furnace 20. The second gas supply tube 38 is provided with a $NH_3$ gas supply valve 24 for opening the tube at the upstream side of the remote plasma unit 37. By opening and closing the gas supply valve 24, the $NH_3$ gas as the second kind of gas is supplied to the reaction furnace 20 or the supply of the gas is stopped. The exhaust tube 40 is provided with an exhaust valve 25 for opening and closing the tube or adjusting the opening of the exhaust valve 25. By opening and closing the exhaust valve 25, the reaction furnace 20 is exhausted and the exhaust is stopped. By adjusting the opening of the exhaust valve 25, the reaction furnace 20 can be exhausted while maintaining a pressure at a predetermined value. The first gas supply tube 41 and the second gas supply tube 38 are respectively provided with MFCs (mass flow controllers) 27 and 28 so that flow rate of gas flowing into the first gas supply tube 41 and the second gas supply tube 38 is controlled. The exhaust valve 25 may be a single valve having a function for opening and closing the tube and adjusting the opening of the valve, or may be a plurality of valves including a valve having the opening and closing function and a vale having the opening adjusting function.

There is provided control means 29 for controlling a pump 26, the valves 22 to 25, a heater (not shown) and the like. The control means 29 controls the exhaust valve 25 and the gas supply valves 22 to 24, flows the DCS gas to the first gas supply tube 41 and reserves the gas in the gas reservoir 21, and supplies the DCS gas reserved in the gas reservoir 21 to the reaction furnace 20 in a state in which the exhaust of the reaction furnace 20 is stopped, thereby bringing the reaction furnace 20 into the pressure-rise state and exposing the substrates W to the DCS gas. By supplying $NH_3$ gas to the reaction furnace 20 from the second gas supply tube 38 through the remote plasma unit 37 while exhausting the reaction furnace 20 by a vacuum pump 26, the substrates W are exposed to the active species obtained by plasma exciting the NH$_3$ gas.

Next, an example of supply of DCS gas and NH$_3$ gas will be explained using FIGS. 2 to 4 which explain three steps. Solid filled valves are closed, and non-filled valves are opened. First, substrates W on which films are to be formed are mounted to the boat 39, and the boat 39 is transferred into the furnace. After the transfer, the following three steps are carried out in succession.

Figure 2:
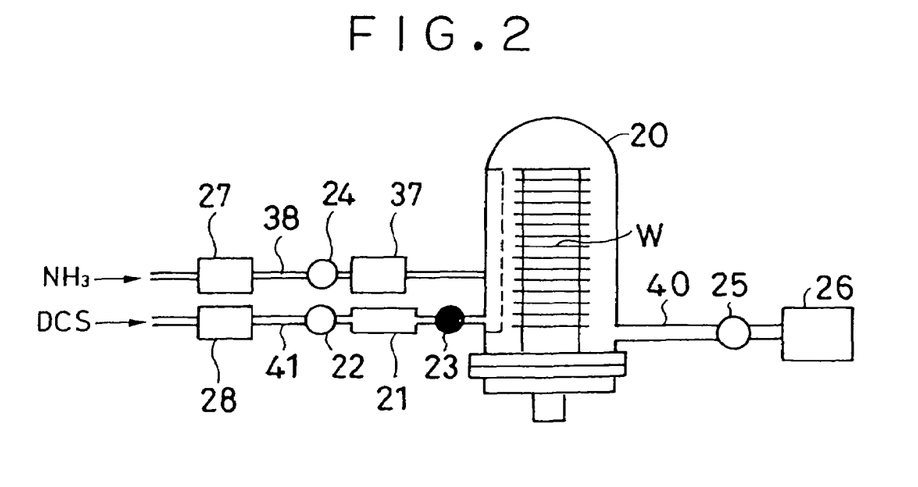
FIG. 2 shows an example of gas supply of DCS and NH$_3$, and is an explanatory view showing s step for supplying and exhausting the NH$_3$ into a furnace and reserving DCS into a gas reservoir.

In step 1 shown in FIG. 2, NH$_3$ gas which needs plasma excitation and DCS gas which does not need plasma excitation are allowed to flow together. First both the valve 24 provided in the gas supply tube 38 and the exhaust valve 25 provided in the exhaust tube 40 are opened, NH$_3$ is plasma excited by the remote plasma unit 37 and brought into active species and supplied from the gas supply tube 38 into the furnace 20 and in this state, the furnace 20 is exhausted from the exhaust tube 40. When NH$_3$ gas is plasma excited and brought into the active species and allowed to flow, the exhaust valve 25 is appropriately adjusted to set a pressure in the furnace to 10 to 100 Pa, more preferable 30 to 50 Pa. The flow rate of NH$_3$ to be supplied which is controlled by the MFC 27 is 1,000 to 10,000 sccm. When NH$_3$ gas is plasma excited and brought into the active species and allowed to flow, if the exhaust valve 25 provided in the exhaust tube 40 is closed and the vacuum exhaust is stopped, the active species which is activated by plasma exciting the NH$_3$ is deactivated before the active species reach the substrates W and as a result, there is a problem that the active species do not react with surfaces of the substrates W. Therefore, when NH$_3$ gas is plasma excited and brought into the active species and allowed to flow, it is necessary to open the exhaust valve 25 and exhaust the reaction furnace 20. A large amount of active species which is activated by plasma exciting the NH$_3$ is allowed to flow, the vacuum exhaust is carried out, a pressure in the furnace is set to 10 to 100 Pa, more preferable 30 to 60 Pa. With this arrangement, films can be formed uniformly and efficiently. Time during which the substrates W are exposed to the active species obtained by plasma exciting the NH$_3$ is 2 to 120 seconds. A temperature in the furnace at that time is set to 350 to 600° C. Since NH$_3$ has a high reaction temperature, NH$_3$ does not react at the temperature in the furnace, NH$_3$ is brought into active species by plasma exciting the same by the remote plasma unit 37, and the active species are allowed to flow toward the downstream side of the valve 24. Therefore, the process can be carried out while keeping the set low temperature in the furnace.

When this NH$_3$ is supplied as active species by plasma excitation, the upstream side valve 22 of the gas supply tube 41 is opened and the downstream side valve 23 is closed, and DCS is also allowed to flow. With this arrangement, DCS is reserved in the gas reservoir 21 provided between the valves 22 and 23. At that time, gas flowing into the furnace is active species obtained by plasma exciting the NH$_3$, and there exists no DCS. Therefore, NH$_3$ does not cause the vapor-phase reaction, NH$_3$ which is plasma excited and become active species reacts in surface with the lower film on the substrate W.

Figure 3:
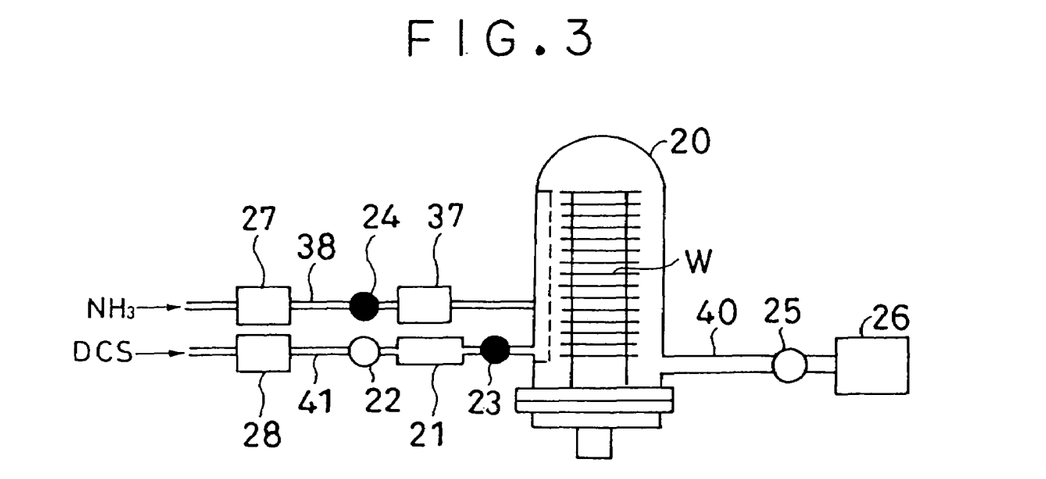
FIG. 3 shows an example of gas supply of DCS and NH$_3$, and is an explanatory view showing s step for exhausting the furnace and successively reserving DCS into the gas reservoir.

In step 2 shown in FIG. 3, the valve 24 of the gas supply tube 38 is closed, the supply of NH$_3$ is stopped, but supply to the gas reservoir 21 is continued. If a predetermined amount of DCS having a predetermined pressure is reserved in the gas reservoir 21, the upstream side valve 22 is also closed, and DCS is captured in the gas reservoir 21. The exhaust valve 25 of the exhaust tube 40 is left opening, the furnace is exhausted to 20 Pa, and remaining NH$_3$ is discharged from the furnace.

At that time, if inert gas such as N$_2$ is supplied into the furnace, an effect of discharging remaining NH$_3$ from the furnace is enhanced. DCS is reserved in the gas reservoir 21 so that a pressure therein becomes 20,000 Pa or higher. Further, the apparatus is constituted such that the conductance between the gas reservoir 21 and the reaction furnace 20 becomes 1.5($10^{-3}$ m$^3$/s or higher. If a ratio of a capacity of the reaction chamber and a capacity of the gas reservoir required for the former capacity is taken into consideration, when the capacity of the reaction chamber is 100 liters, 100 to 300 cc is preferable. As a capacity ratio, the gas reservoir preferably has 1/1,000 to 3/1,000 times of the capacity of the reaction chamber.

Figure 4:
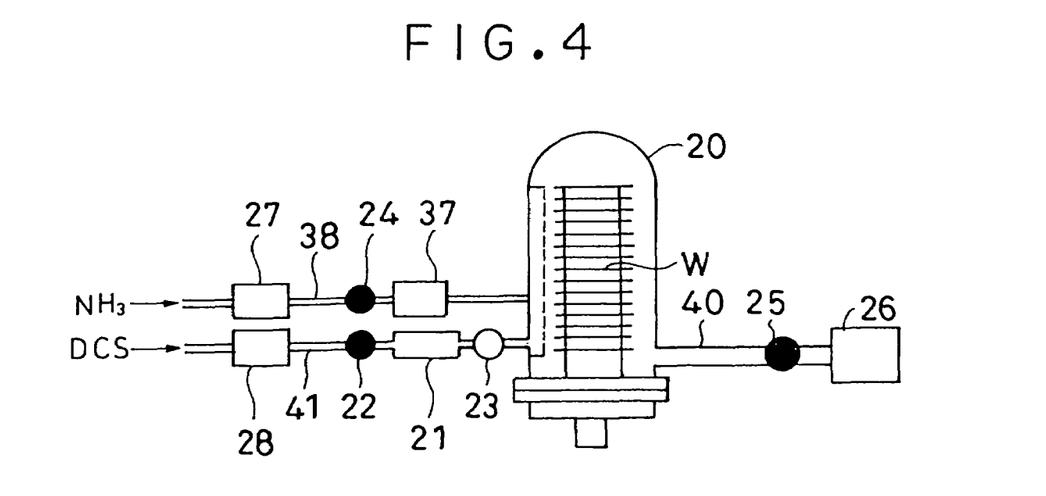
FIG. 4 shows an example of gas supply of DCS and NH$_3$, and is an explanatory view showing s step for closing an exhaust valve and supplying DCS in the gas reservoir into the furnace.

In step 3 shown in FIG. 4, if the exhaust in the furnace is completed, the valve 25 of the exhaust tube 40 is closed and the exhaust is stopped. The downstream side valve 23 of the first gas supply tube 41 is opened. With this, DCS reserved in the gas reservoir 21 is supplied into the furnace 20 at a dash. At that time, since the valve 25 of the exhaust tube 40 is closed, a pressure in the furnace abruptly rises to about 931 Pa (7 Torr). Time for supplying DCS is set to 2 to 4 seconds and thereafter, time for exposing to the increased pressure atmosphere is set to 2 to 4 seconds, and total time is 6 seconds. A temperature in the furnace at that time is the same as that when NH$_3$ is supplied, and is 350 to 600° C. By the supply of DCS, NH$_3$ and DCS on the lower film are reacted in surface, and Si$_3$N$_4$ films are formed on the substrates. After the films are formed, the valve 23 is closed, the valve 25 is opened, the reaction furnace 20 is vacuum exhausted, remaining DCS gas which contributed to the film formation is discharged from the furnace. At that time, is inert gas such as N$_2$ is supplied into the furnace, an effect for discharging, from the furnace, further remaining DCS gas which contributed to the film formation is enhanced. The valve 22 is opened, and supply of DCS to the gas reservoir 21 is started.

The steps 1 to 3 are defined as one cycle, and this cycle is repeated a plurality of times, thereby forming Si$_3$N$_4$ films having predetermined thickness on the substrates.

In the ALD apparatus, gas is adsorbed in a surface of the lower film. An adsorbing amount of gas is proportional to gas pressure and gas-exposing time. Therefore, in order to adsorb a desired constant amount of gas in a short time, it is necessary to increase the gas pressure for a short time. In this point, in the embodiment, the exhaust valve 25 is closed and in this state, DCS reserved in the gas reservoir 21 is instantaneously supplied. Therefore, it is possible to abruptly rise the pressure of DCS in the furnace, and a desired constant amount of gas can instantaneously be adsorbed.

In this embodiment, while DCS is reserved in the gas reservoir 21, NH$_3$ gas is plasma excited and brought into active species and supplied, and the furnace is exhausted as steps required by the ALD method. Therefore, no special step for reserving DCS is not required. Further, since the DCS is allowed to flow after the furnace is exhausted and NH$_3$ gas is removed, both the gases are not reacted before they reach the substrates. The supplied DCS can effectively be reacted only with NH$_3$ which is adsorbed in the substrate W.

Figure 5:
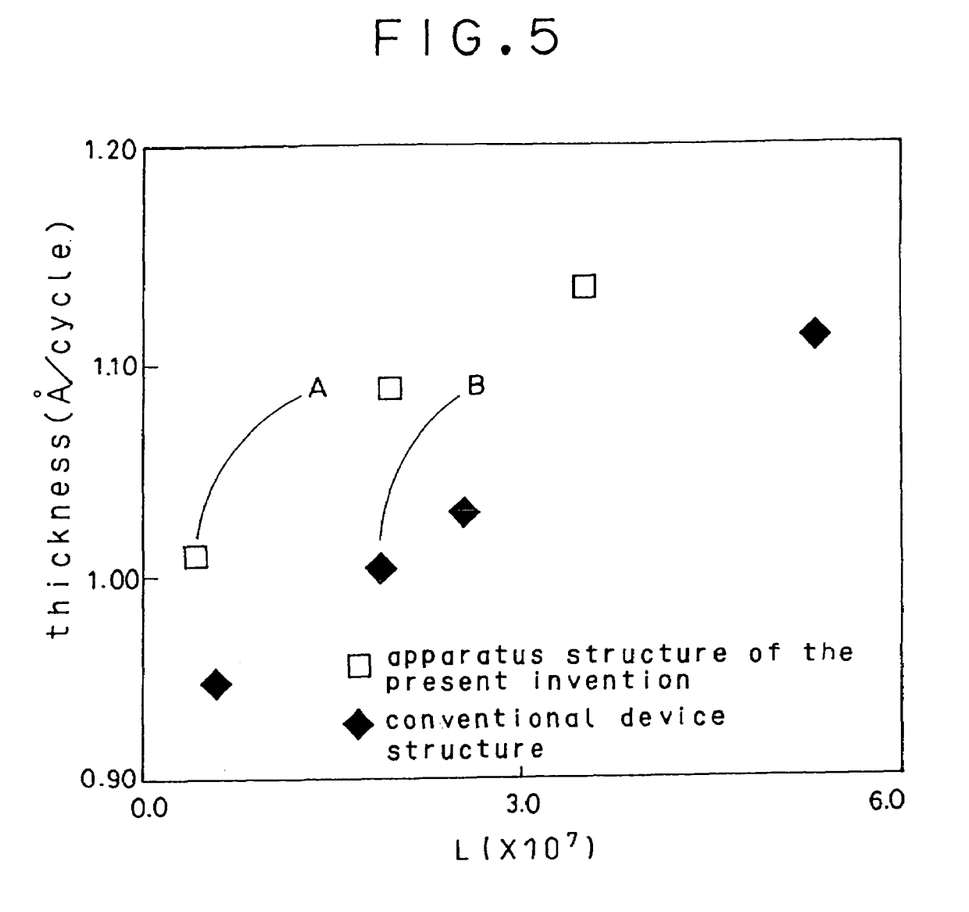
FIG. 5 shows comparative characteristics between the present invention and prior art showing a relation between an adsorbing amount and a film-forming speed.

FIG. 5 shows a relation between an absorption amount of gas and a film-forming speed, and shows a comparison between an apparatus structure of the present invention in which DCS is increased in pressure and supplied using a gas reservoir and a conventional apparatus structure in which DCS is supplied while controlling the exhaust state. A lateral axis shows gas molecule adsorbing amount L (Langmuir: product of gas pressure and gas exposing time), and a vertical axis shows a film thickness per one cycle (Å/cycle). If film-forming speeds per one cycle are compared, even if the gas molecule adsorbing amount L (Langmuir) is the same, the film thickness per one cycle can be increased in the present invention as compared with the conventional apparatus. If the gas exposing times with respect to the same film thickness are compared, in data A obtained by the apparatus structure of the present invention, L is 0.38 and a thickness is 1.009 Å/cycle. In the case of data B obtained by the conventional apparatus structure corresponding to the data A, L is 1.86 and the thickness is 1.003 Å/cycle. Since the thicknesses in data A and data B are substantially the same and the pressures are the same, it is found that the gas exposing time of data A is about ⅕ times of data B, and the throughput of the present invention is largely enhanced.

Therefore, if a pressure rises, the film-forming speed rises. In a process in which a reaction chamber is once exhausted and then the process gas is supplied and these operations are repeated like the ALD, if a pressure is increased using the gas reservoir as in the present embodiment, it is possible to largely enhance the throughput as compared with a case in which a pressure is not increased using the gas reservoir. Especially in a vertical type ALD apparatus which has a great furnace capacity and which repeats an operation in which the reaction chamber is once exhausted and then the process gas is supplied thereby forming films, in order to enhance the throughput, it is absolutely necessary to provide a gas reservoir and instantaneously rise the pressure.

In the above embodiment, one gas tank or helical tube is provided as the gas reservoir. The present invention is not limited to this, and a plurality of gas reservoirs may be provided in parallel. The gas reservoir of the invention is not limited to the gas tank or helical tube, and any means may be employed only if gas can be reserved and the gas can be discharged out at a dash. For example, a supply tube of DCS may be thicker than a normal tube, and a capacity of the MFC may be increased correspondingly. A plurality of supply tubes of DCS may be provided. In this case, the number of cylinders which become DCS supply source may be increased in accordance with the number of supply tubes. Since DCS has low vapor pressure, the cylinder may be heated to increase a vaporization amount of DCS. The DCS may forcibly be sent into the furnace using a pump.

In the above-described embodiment, the present invention is applied to the vertical type semiconductor device producing apparatus, but the invention can also be applied to a producing method of a semiconductor device. According to the producing method of a semiconductor device, vacuum exhaust in the reaction chamber and supply of process gas into the reaction chamber are repeated, substrates stacked in the reaction chamber are processed, first kind of gas is reserved in an intermediate portion of a supply path through which the first kind of gas flows, the exhaust of the reaction chamber is stopped and in this state, the first kind of gas reserved in the intermediate portion of the supply path is supplied to the reaction chamber to bring the reaction chamber into the pressure-rise state, and films are formed on the substrates. According to this method, since the first kind of gas reserved in the gas reservoir is supplied to the reaction chamber in the state in which the exhaust is stopped, the first kind of gas can be supplied instantaneously, and a pressure in the reaction chamber can rise. Therefore, even with a vertical type reaction chamber having great capacity, when the vacuum exhaust in the reaction chamber is switched to the supply of process gas into the reaction chamber, a pressure in the reaction chamber can rise without delay, it is possible to enhance the adsorption to the substrate and the film-forming speed, and the throughput can largely be enhanced.

The entire disclosure of Japanese Patent Application No. 2002-109130 filed on Apr. 11, 2002 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A method of producing a semiconductor device, comprising:
    providing a reaction chamber with a substrate; and
    sequentially repeating a substrate processing cycle to process the substrate disposed in the reaction chamber, the cycle comprising:
        supplying a first kind of gas, into the reaction chamber;
        exhausting the first kind of gas from the reaction chamber;
        supplying a second kind of gas into the reaction chamber; and
        exhausting the second kind of gas from the reaction chamber,
    wherein the first kind of gas is pre-reserved in an intermediate portion of a supply path through which the first kind of gas flows, and the first kind of gas reserved in the intermediate portion of the supply path is supplied into the reaction chamber with exhaust of the reaction chamber being substantially stopped.

2. The method of producing a semiconductor device as recited in claim 1, wherein the second kind of gas is activated by plasma-excitation.

3. The method of producing a semiconductor device as recited in claim 1, wherein the second kind of gas is $NH_3$.

4. The method of producing a semiconductor device as recited in claim 2, wherein
    the second kind of gas is supplied into the reaction chamber while the reaction chamber is exhausted.

5. The method of producing a semiconductor device as recited in claim 4, wherein
    in supplying the second kind of gas, a pressure of the reaction chamber is kept in a predetermined pressure range.

6. The method of producing a semiconductor device as recited in claim 5, wherein
    in supplying the second kind of gas; the pressure of the reaction chamber is set from approximately 10 Pa to approximately 100 Pa.

7. The method of producing a semiconductor device as recited in claim 6, wherein
    in supplying the second kind of gas, the pressure of the reaction chamber is set from approximately 30 Pa to approximately 60 Pa.

8. The method of producing a semiconductor device as recited in claim 1, wherein
    the first kind of gas is not activated by plasma-excitation.

9. The method of producing a semiconductor device as recited in claim 8, wherein
    in supplying the, second kind of gas, the pressure of the reaction chamber is set from approximately 266 Pa to approximately 931 Pa.

10. The method of producing a semiconductor device as recited in claim 1, wherein
    the first kind of gas is dichlorsilane.

11. The method of producing a semiconductor device as recited in claim 1, wherein the first kind of gas is pre-reserved in a gas reservoir disposed at the intermediate portion of the supply path.

12. The method of producing a semiconductor device as recited in claim 11, wherein
the second kind of gas is supplied into the reaction chamber while the first gas is reserved in the gas reservoir.

13. The method of producing a semiconductor device as recited in claim 11, wherein
the first kind of gas is reserved in the gas reservoir until a pressure in the gas reservoir reaches approximately 20,000 Pa.

14. The method of producing a semiconductor device as recited in claim 11, wherein
a capacity of the gas reservoir is approximately 1/1,000 to approximately 3/1,000 of a capacity of the reaction chamber, 15. A method of producing a semiconductor device, comprising:
providing a reaction chamber with a substrate; and
sequentially repeating a substrate processing cycle to process the substrate disposed in the reaction chamber, the cycle comprising:
supplying a first kind of gas into the reaction chamber;
exhausting the first kind of gas from the reaction chamber;
supplying a second kind of gas into the reaction chamber; and
exhausting the second kind of gas from the reaction chamber,
wherein the first kind of gas is pre-reserved in an intermediate portion of a supply path through which the first kind of gas flows, and the first kind of gas reserved in the intermediate portion of the supply path is supplied into the reaction chamber, without being activated by plasma excitation, while exhaust of the reaction chamber is substantially stopped, and
the second kind of gas is supplied into the reaction chamber, with the second kind of gas being activated by plasma-excitation, while the reaction chamber is exhausted.

16. The method of producing a semiconductor device as recited in claim 15, wherein the second kind of gas is $NH_3$.

17. The method of producing a semiconductor device as recited in claim 15, wherein
the first kind of gas is dichlorsilane.

18. The method of producing a semiconductor device as recited in claim 16, wherein
the first kind of gas is dichlorsilane, and the substrate disposed in the reaction chamber is processed while the substrate is heated at a temperature ranging from approximately 350° C. to approximately 600° C.

19. The method of producing a semiconductor device as recited in claim 17, wherein
the first kind of gas is pre-reserved in a gas reservoir disposed at the intermediate portion of the supply path.

20. A method of producing a semiconductor device, comprising:
providing a reaction chamber with a substrate; and
sequentially repeating a substrate processing cycle to process the substrate disposed in the reaction chamber, the cycle comprising:
supplying a first kind of gas into the reaction chamber;
exhausting the first kind of gas from the reaction chamber;
supplying a second kind of gas into the reaction chamber; and
exhausting the second kind of gas from the reaction chamber,
wherein the first kind of gas is pre-reserved in an intermediate portion of a supply path through which the first gas flows, and the first gas reserved in the intermediate portion of the supply path is supplied into the reaction chamber while exhaust of the reaction chamber is substantially stopped to raise a pressure of the reaction chamber to 166 Pa or more.

* * * * *